United States Patent
Hou et al.

(10) Patent No.: US 11,270,937 B2
(45) Date of Patent: Mar. 8, 2022

(54) INTEGRATED INDUCTOR WITH MAGNETIC MOLD COMPOUND

(71) Applicant: TEXAS INSTRUMENTS INCORPORATED, Dallas, TX (US)

(72) Inventors: Dongbin Hou, Plano, TX (US); Steven Alfred Kummerl, Carrollton, TX (US); Roberto Giampiero Massolini, Pavia (IT); Joyce Marie Mullenix, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 22 days.

(21) Appl. No.: 16/232,684

(22) Filed: Dec. 26, 2018

(65) Prior Publication Data

US 2020/0211959 A1 Jul. 2, 2020

(51) Int. Cl.
| | |
|---|---|
| *H01L 23/522* | (2006.01) |
| *H01L 23/00* | (2006.01) |
| *H01L 23/495* | (2006.01) |
| *H01L 23/29* | (2006.01) |
| *H01L 21/56* | (2006.01) |
| *H01L 49/02* | (2006.01) |

(52) U.S. Cl.
CPC ........ *H01L 23/5227* (2013.01); *H01L 21/565* (2013.01); *H01L 23/29* (2013.01); *H01L 23/4952* (2013.01); *H01L 23/49534* (2013.01); *H01L 24/09* (2013.01); *H01L 28/10* (2013.01)

(58) Field of Classification Search
None
See application file for complete search history.

(56) References Cited

U.S. PATENT DOCUMENTS

| | | | |
|---|---|---|---|
| 10,714,412 B2 * | 7/2020 | Mullenix | H01L 23/4952 |
| 2003/0137385 A1 * | 7/2003 | Ahn | H01F 17/0033 336/200 |
| 2004/0238857 A1 * | 12/2004 | Beroz | H01L 23/36 257/232 |
| 2015/0243639 A1 * | 8/2015 | How | H01L 24/00 257/676 |
| 2018/0025999 A1 * | 1/2018 | Yu | H01L 23/485 257/428 |

* cited by examiner

Primary Examiner — Alexander G Ghyka
(74) Attorney, Agent, or Firm — Valerie M. Davis; Charles A. Brill; Frank D. Cimino

(57) ABSTRACT

An integrated circuit (IC) package comprises a semiconductor die, a leadframe comprising a plurality of leads coupled to bond pads on the semiconductor die, and an electrically conductive member electrically coupled to the leadframe. A magnetic mold compound encapsulates the electrically conductive member to form an inductor. A non-magnetic mold compound encapsulates the semiconductor die, the leadframe, and the magnetic mold compound.

19 Claims, 5 Drawing Sheets

INTEGRATED INDUCTOR WITH MAGNETIC MOLD COMPOUND

BACKGROUND

Many types of electrical circuits include inductors. Electrical circuits are often fabricated in the form of an integrated circuit (IC). Integrating an inductor into an IC package with the die that includes the integrated circuit has proven to be problematic due to the relatively large size of inductors and other issues. For example, an on-wafer integrated inductor may have limited current handling ability due to a relatively high resistance associated with the inductor. A package level integration of semiconductor with a discrete inductor or magnetic core block may be expensive and may require a relatively complex assembly process.

SUMMARY

An integrated circuit (IC) package comprises a semiconductor die, a leadframe comprising a plurality of leads coupled to bond pads on the semiconductor die, and an electrically conductive member electrically coupled to the leadframe. A magnetic mold compound encapsulates the electrically conductive member to form an inductor. A non-magnetic mold compound encapsulates the semiconductor die, the leadframe, and the magnetic mold compound.

BRIEF DESCRIPTION OF THE DRAWINGS

For a detailed description of various examples, reference will now be made to the accompanying drawings in which.

DETAILED DESCRIPTION

The disclosed examples are directed to an inductor integrated into a semiconductor package. The inductor is formed as a conductive member encapsulated by a magnetic mold compound. In some examples, multiple such inductors are integrated into the semiconductor package. One illustrative use of a multi-inductor semiconductor package is as a multiphase voltage regulator. For example, the semiconductor package includes a die on which a multiphase buck converter integrated circuit is formed. Each phase of the buck converter is coupled to one of the aforementioned inductors. Other uses of the integrated inductor are possible as well.

Figure 1:
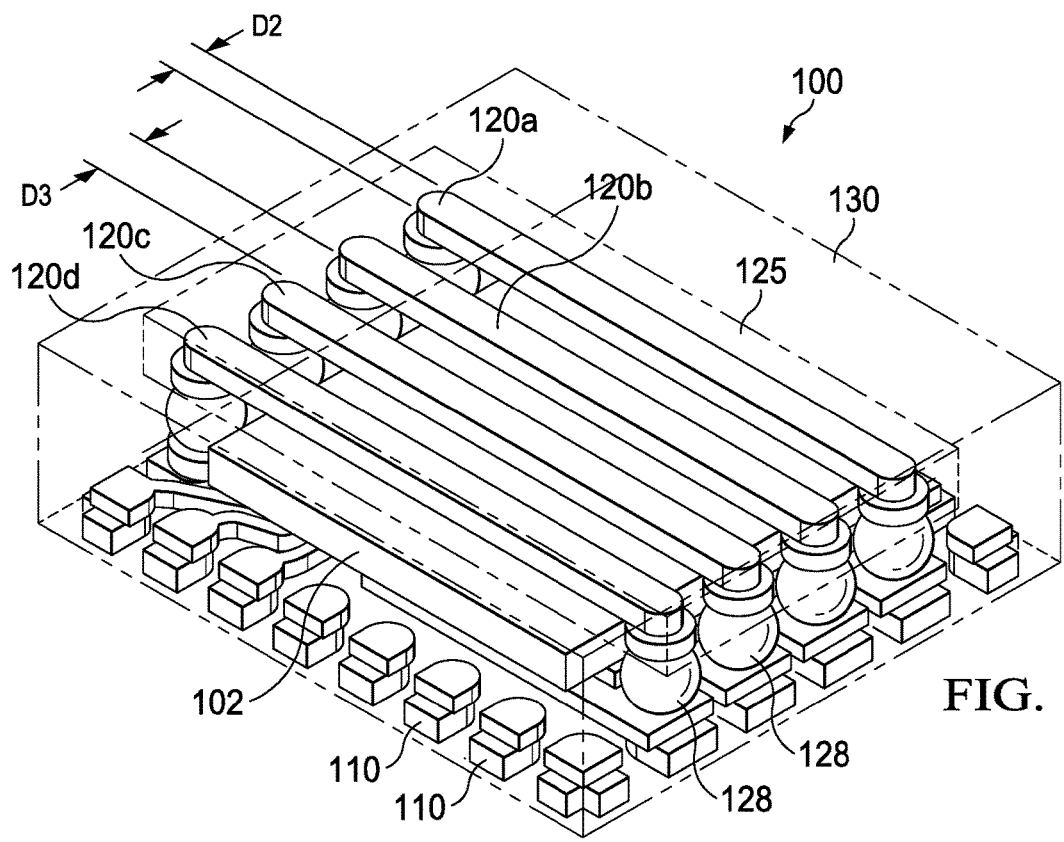
FIG. 1 illustrates an IC package including integrated inductors coupled to a leadframe via solder balls.
Figure 2:
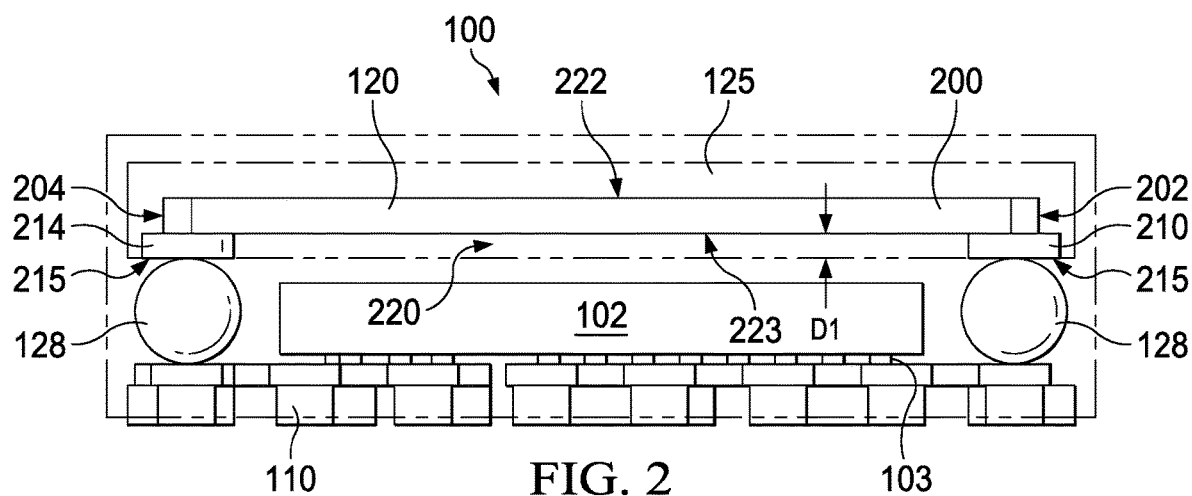
FIG. 2 shows a side view of the example IC package of FIG. 1.

FIGS. 1 and 2 show an example of an IC package 100. The IC package 100 in this example includes a semiconductor die 102, a leadframe 110, and multiple electrically conductive members 120a, 120b, 120c, and 120d (collectively electrically conductive members 120) encapsulated by a magnetic mold compound 125. The semiconductor die 102, the leadframe 110, and the magnetic mold compound 125 are then encapsulated by a protective mold compound 130. The protective mold compound 130 is not magnetic in some examples, but can be magnetic in other examples.

The semiconductor die 102 includes an integrated circuit formed thereon. The integrated circuit can perform any of a variety of functions. In one example, the integrated circuit is a voltage regulator. An example of such a voltage regulator is buck converter. In some cases, the semiconductor die 102 includes a multiphase buck converter integrated circuit formed thereon. In some implementations, a multiphase buck converter includes multiple pairs of power transistors. Each transistor pair includes a high side transistor and a low side transistor coupled together at a switch node. An inductor is coupled to the switch node and also to ground through a capacitor. A multiphase buck converter may share one capacitor among the multiple phases. In one example, the semiconductor die 102 includes the multiple transistors and the capacitor, but not the inductors. The inductors are provided outside the semiconductor die 102 but still within the IC package 100. The combination of the multiple electrically conductive members 120a-120d and the surrounding magnetic mold compound 125 form a plurality of inductors. That is, each inductor comprises one of the electrically conductive members 120a-120d encapsulated by the magnetic mold compound 125. In the example of FIG. 1, the IC package 100 includes four electrically conductive members 120a-120d encapsulated in the magnetic mold compound 125, and thus four inductors. In this example, a multiphase buck converter implemented on the semiconductor die 102 may comprise a four phase buck converter.

FIG. 2 shows that the semiconductor die 102 has a plurality of bond pads 103. Each bond pad 103 provides an electrical connection to a node or component within the integrated circuit formed within the semiconductor die 102. With the semiconductor die 102 placed on the leadframe 110, the bond pads 103 electrically couple to corresponding leads of the leadframe by a die attach process. The semiconductor die 102 is a flip-chip structure in this example.

As noted above, the electrically conductive members 120a-120d are encapsulated with the magnetic mold compound 125. The magnetic mold compound 125 includes ferromagnetic materials such as ferrite M33, nickel, ferrite N41, iron, ferrite T38, silicon GO steel, and supermalloy to list a few. These materials have sufficiently high relative permeabilities to make the inductors. Table I below lists the ferromagnetic materials and their relative permeabilities.

TABLE I

| Ferromagnetic Material | Relative Permeability |
| --- | --- |
| Ferrite M33 | 750 |
| Nickel | 600 |
| Ferrite N41 | 2800 |
| Ferrite T38 | 10,000 |
| Silicon GO steel | 40,000 |
| Supermalloy | 1,000,000 |

The magnetic mold compound 125 also has a relatively high-permeability compared to the permeability of air. In one example, the magnetic mold compound has a relative permeability of at least 5, which is approximately five times that of air. In other examples, the magnetic mold compound has a relative permeability of 10-40. In some examples, the magnetic mold compound also has a relative permittivity of at least 10.

FIG. 2 illustrates that each electrically conductive member 120 includes a substantially straight member 200 having opposing ends 202 and 204. The electrically conductive member 120 also includes a pair of standoffs 210 and 214. Standoff 210 is provided at the end 202 of the electrically conductive member 120 and standoff 214 is provided at and 204. The substantially straight member 200 and the standoffs 210 and 214 are formed of a conductive metal (e.g., copper, gold, etc.) and may be made from the same material as leadframe 110. The standoffs 210 and 214 elevate the substantially straight member 200 a distance D1 over the bottom edge 215 of the standoffs so as to create a space 220 on a side of the substantially straight member 200 adjacent the semiconductor die 102.

The magnetic mold compound 125 is initially present in a generally liquid form and flows on the top side 222 and the bottom side 223 of the substantially straight member 200 as shown in FIG. 2. The standoffs 210, 214 create the space 220 into which the magnetic mold compound 125 is permitted to flow to thereby encapsulate the electrically conductive member 120. As illustrated in FIG. 1, the magnetic mold compound 125 also surrounds the sides of each substantially straight member and thus flows between adjacent electrically conductive members 120.

Following their encapsulation in the magnetic mold compound 125, the electrically conductive members 120 are placed over the semiconductor die 102 and electrically attached to the leadframe 110 using solder balls 128 (FIG. 1) at opposing ends 202 and 204 of each electrically conductive member 120. The solder balls 128 are heated to reflow and thus to electrically connect the conductive standoffs 210, 214 (and thus the electrically conductive member 120) to corresponding leads on the leadframe 110. Through the leadframe 110, each electrically conductive member (which is an inductive device) electrically connects to the integrated circuit formed in the semiconductor die 102.

In the examples of FIGS. 1 and 2, each electrically conductive member 120 connects to the leadframe 110 via a solder ball 128. The example of FIG. 3 is similar to that of FIGS. 1 and 2 with the exception that electrically conductive members 120 are coupled to the leadframe via conductive pillars 135 instead of solder balls.

The width of each electrically conductive member 120 is designated as D2 (FIG. 1), and the distance between adjacent electrically conductive members 120 is designated as D3. Unwanted electromagnetic coupling (e.g., cross talk) between the inductors can be controlled and reduced through selection of values for D2 and D3. That is, cross talk between the inductors can be controlled through selection of the width of each electrically conductive member 120 as well as the spacing between adjacent electrically conductive members 120. In one example, D2 is 180 micrometers and in another example D2 is 250 micrometers.

Figure 3:
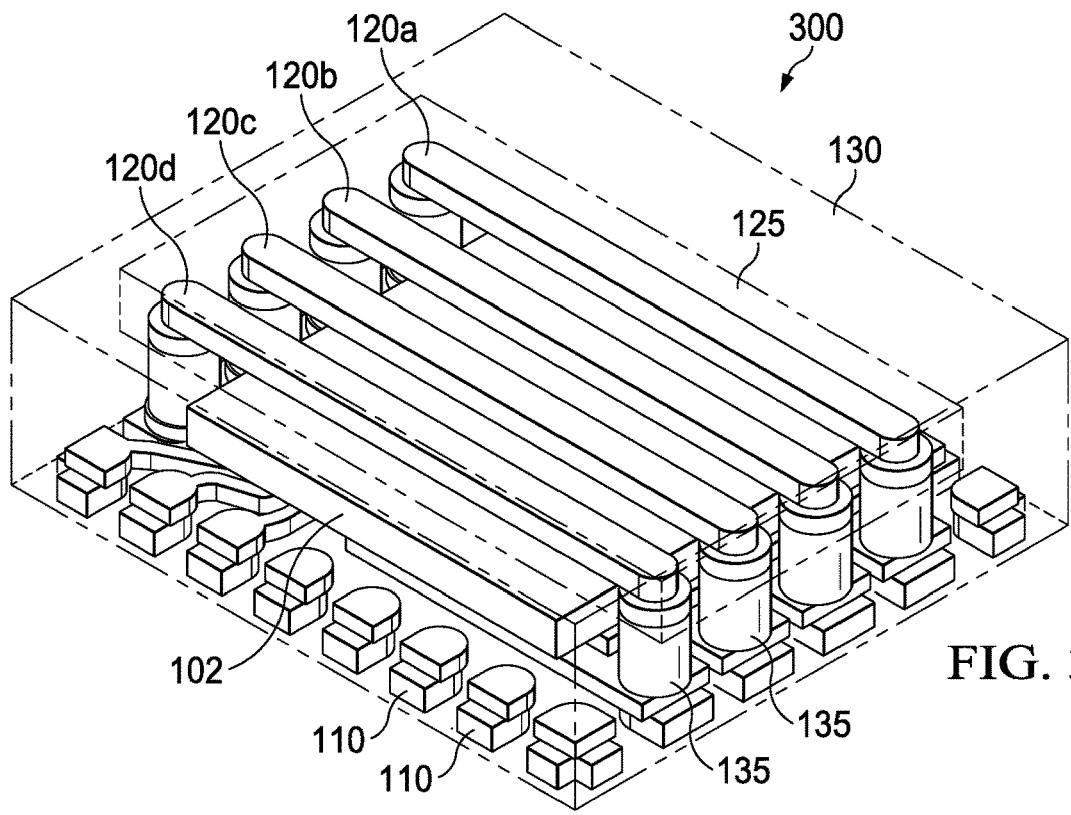
FIG. 3 shows an example in which the integrated inductors are coupled to the leadframe via conductive pillars.
Figure 4:
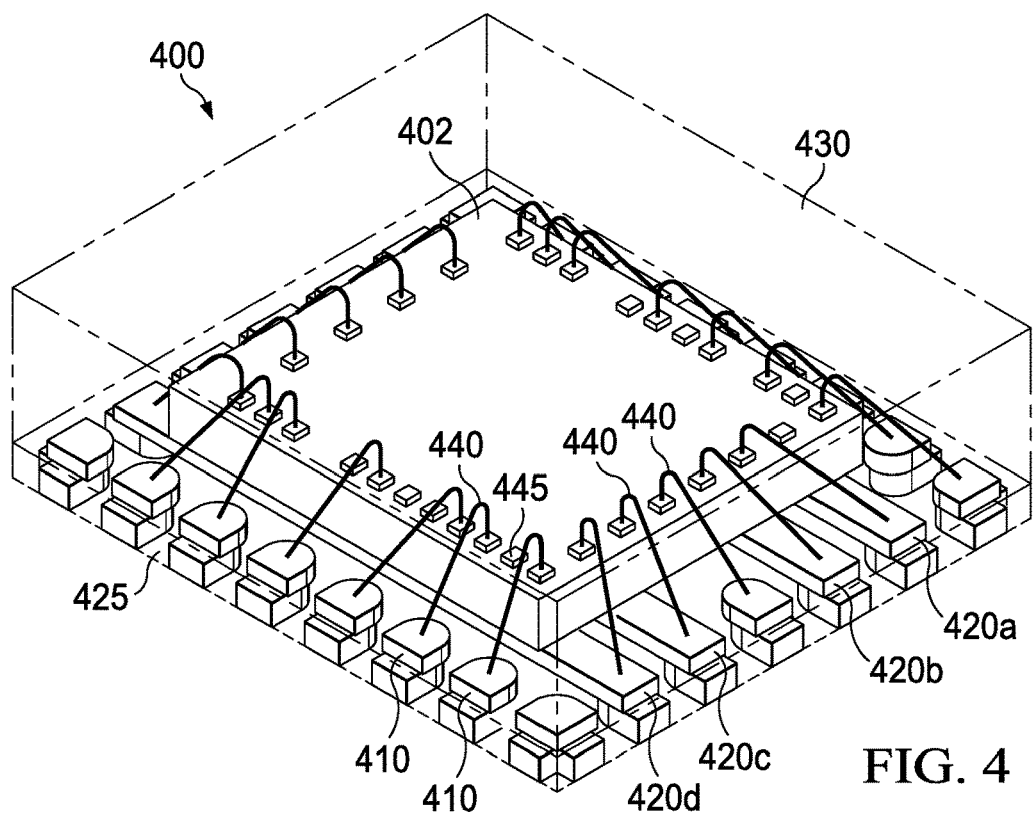
FIG. 4 shows an example of an IC package in which the integrated inductors are on the same side of the semiconductor die as the leadframe.

In the example of FIGS. 1-3, the inductors formed from the electrically conductive members 120 encapsulated in magnetic mold compound 125 are provided on the opposite side of the semiconductor die 102 from the leadframe 110. The example of FIG. 4 illustrates the inductors provided on the same of the semiconductor die as the leadframe. FIG. 4 shows an example of an IC package 400 that includes a semiconductor die 402 attached to a leadframe 410. The inductors in this example comprise electrically conductive members 420a, 420b, 420c, and 420d (collectively electrically conductive members 420) encapsulated in magnetic mold compound 425 and residing on the same side of the semiconductor die 402 as leadframe 410. Bond pads 445 on the semiconductor die 402 in this example are connected to the leadframe by way of wire bonds 440 as shown. The combination of the semiconductor die 402 and the inductors is then encapsulated by a non-magnetic protective mold compound 430.

Figure 5:
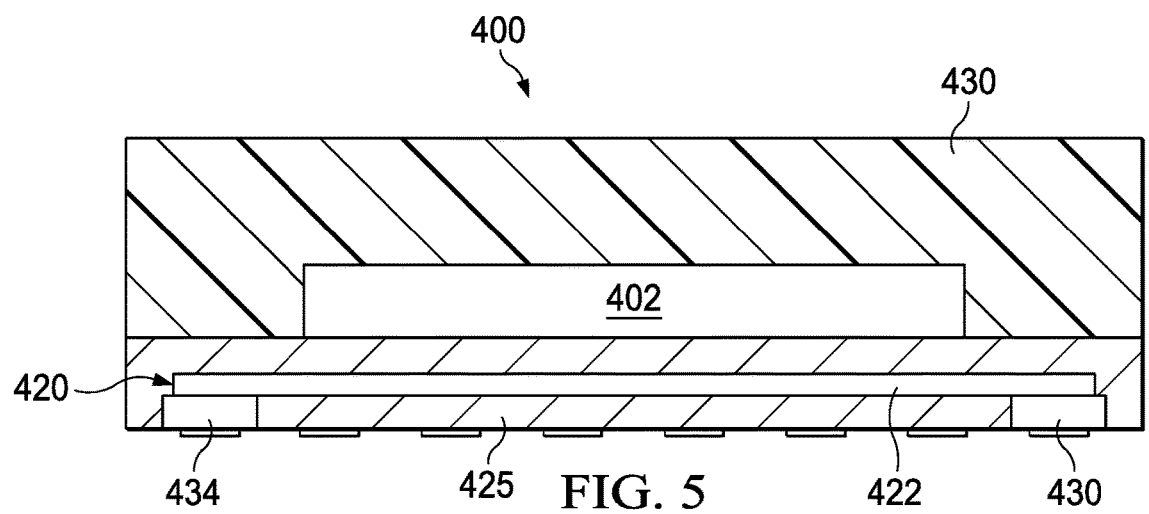
FIG. 5 shows a side view of the example IC package of FIG. 4.

FIG. 5 shows a side view of the example of FIG. 4. The wire bonds are not shown. The structure of each electrically conductive member 420 is similar to that in FIGS. 1-3 in that each electrically conductive member 420 includes a substantially straight member 422 which rests on top of and is attached to standoffs 430 and 434 positioned at opposing ends of the substantially straight member 422. As a result, the magnetic mold compound 425 is able to fill the space below each electrically conductive member 420, as well as the space above each electrically conductive member 420 and between adjacent electrically conductive members 420.

Figure 6:
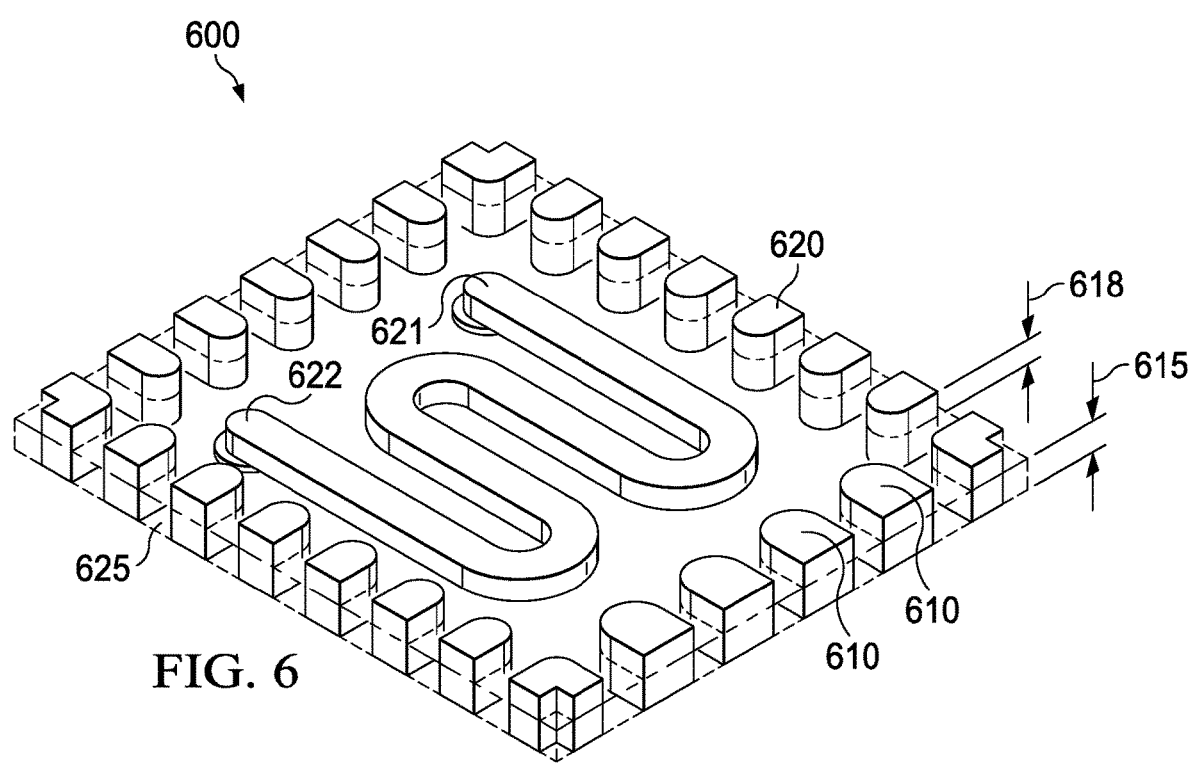
FIG. 6 shows an example of an IC package containing a serpentine-shaped integrated inductor.
Figure 7:
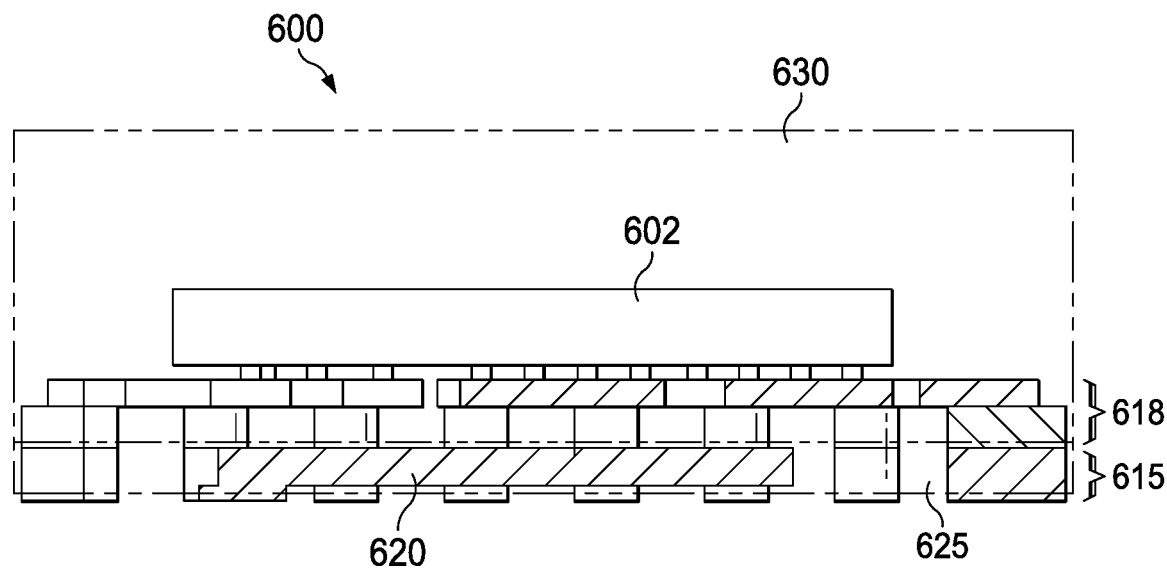
FIG. 7 shows a side view of the example IC package of FIG. 6.

In the examples of FIGS. 1-5, each inductor comprises a substantially straight conductive member. FIGS. 6 and 7 illustrate an inductor provided in an IC package 600 that is serpentine-shaped. The inductor comprises an electrically conductive member 620 that includes two or more turns. The example electrically conductive member 620 includes in FIG. 6 includes three turns between end portions 621 and 622. End portions 621, 622 electrically couple to lead frame 610. The serpentine-shaped electrically conductive member 620 is encapsulated in a magnetic mold compound 625. A non-magnetic mold compound 630 also is present. The leadframe 610 in this example includes two layers 615 and 618. The inductor formed from the electrically conductive member 620 is provided in layer 615. Layer 618 of the leadframe electrically connects to the semiconductor die 602 as shown in FIG. 7. The inductor in this example is thus provided on the same side of the semiconductor die 602 as the leadframe. The inductor in this example has a curved serpentine shape, but the serpentine shape can have straight edges and ninety degree angles in other examples.

Figure 8:
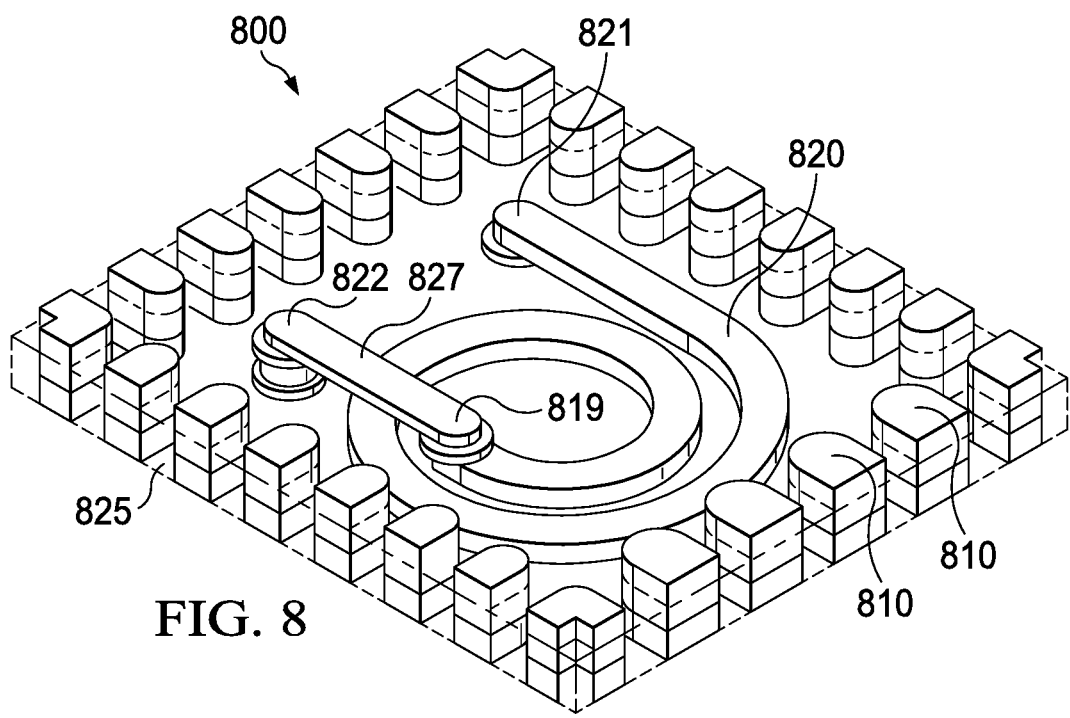
FIG. 8 shows an example of an IC package containing a spiral-shaped integrated inductor.
Figure 9:
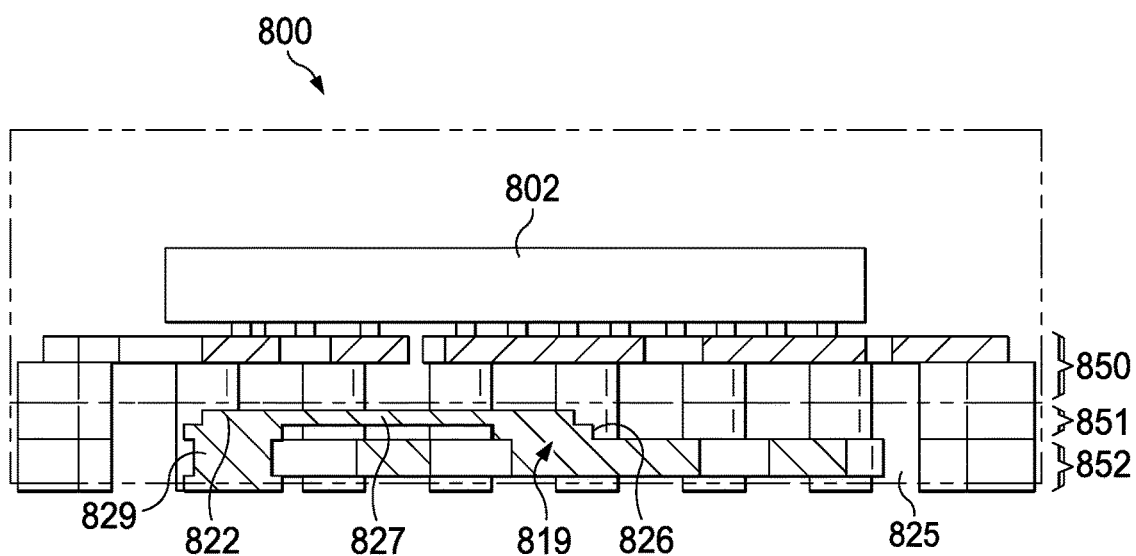
FIG. 9 shows a side view of the example IC package of FIG. 8.

FIGS. 8 and 9 show an example of an IC package 800 in which the inductor is spiral-shaped. The inductor in this example comprises an electrically conductive member 820. The spiral-shaped electrically conductive member 820 is encapsulated in a magnetic mold compound 825 and has opposing ends 821 and 822. The leadframe 810 in this example includes three layers 850, 851, and 852. The inductor formed from the electrically conductive member 820 is provided in layers 851 and 852. Layer 850 of the leadframe electrically connects to the semiconductor die 802 as shown in FIG. 9. The electrically conductive member 820 includes two loops (720 degrees) between end 821 and point 819. That portion of the electrically conductive member 820 resides within layer 852. A standoff post 826 is provided at 819 and a conductive bridge 827 then connects between the standoff post 826 and end 822. Another post 829 is provided at end 822. The bridge 826 is provided in layer 851. Ends 821 and 822 connect to corresponding leads of the leadframe. The inductor in this example is thus provided on the same side of the semiconductor die 802 as the leadframe. The inductor in this example has a curved spiral shape, but the spiral shape can have straight edges and ninety degree angles in other examples.

Figure 10:
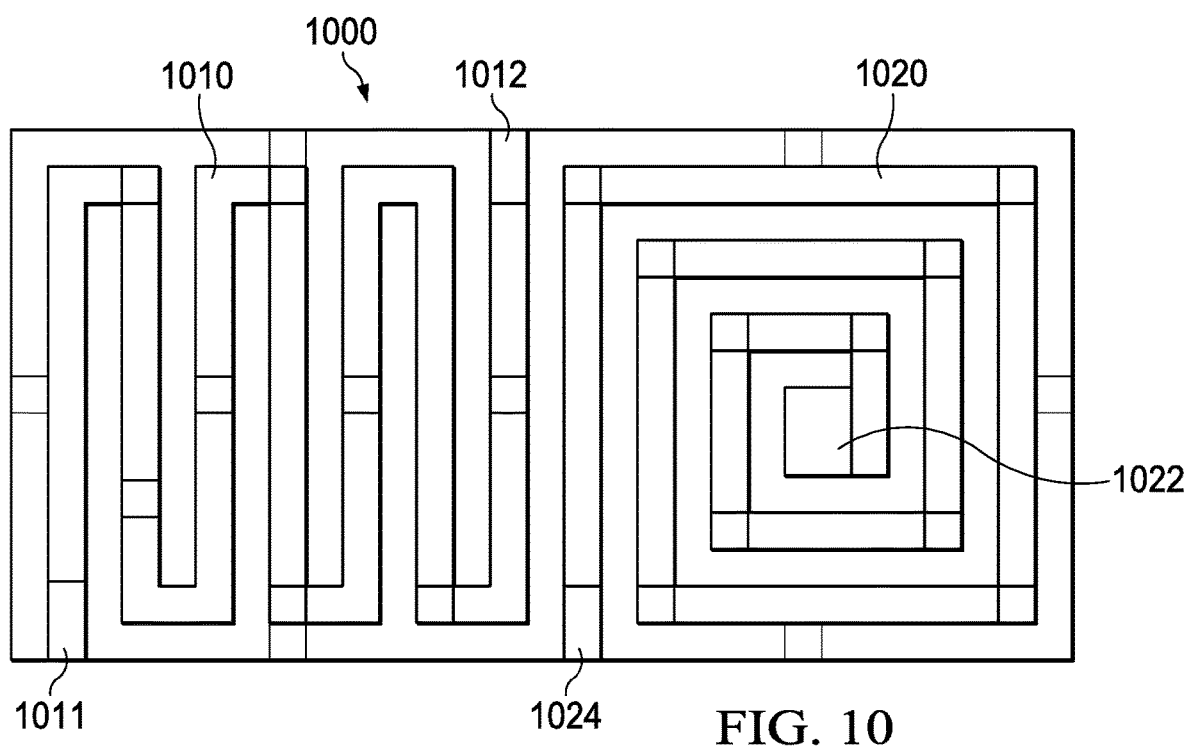
FIG. 10 shows an example of an IC package in which one inductor is serpentine-shaped and another inductor is spiral-shaped.

FIG. 10 shows an example in which two inductors 1010 and 1020 are provided within an IC package 1000. Inductor 1010 is serpentine-shaped and inductor 1020 is spiral shaped. The inductors are provided side-by-side and may be on the same side of the semiconductor die as the leadframe or on the opposite side of the semiconductor die from the leadframe as in the prior examples. Inductor 1010 includes an electrically conductive member, as was the case above, and has terminals 1011 and 1012. Inductor 1020 also includes an electrically conductive member and has terminals 1021 and 1022. Both inductors are encapsulated in a magnetic mold compound such as that described above. The inductors in this example have straight line shapes with ninety degree angles, but the shapes of the inductors can be curved in other examples.

In this description, the term "couple" or "couples" means either an indirect or direct connection. Thus, if a first device couples to a second device, that connection may be through a direct connection or through an indirect connection via other devices and connections. Modifications are possible in the described embodiments, and other embodiments are possible, within the scope of the claims.

What is claimed is:

1. An integrated circuit (IC) package, comprising:
   a semiconductor die having bond pads;
   a leadframe having leads coupled to respective ones of the bond pads;
   a first electrically conductive member separate from the leadframe, the electrically conductive member having opposed ends and having a standoff on at least one of the ends, the standoff being coupled to the leadframe;
   a magnetic mold compound encapsulating the first electrically conductive member to form a first inductor; and
   a second mold compound around the semiconductor die, the leadframe, and the magnetic mold compound.

2. The IC package of claim 1, in which the first inductor is on a same side of the semiconductor die as the leadframe.

3. The IC package of claim 1, in which the inductor first electrically conductive member has a shape that is one of spiral or serpentine.

4. The IC package of claim 1, including a second electrically conductive member encapsulated by the magnetic mold compound to form a second inductor, the second electrically conductive member being separate from the leadframe, having opposed ends, and having a standoff on at least one of the ends, the standoff being coupled to the leadframe.

5. The IC package of claim 4, in which the first and second inductors have different shapes.

6. The IC package of claim 4, in which the first inductor is spiral-shaped, and the second inductor is serpentine-shaped.

7. The IC package of claim 1, in which the first electrically conductive member is coupled to the leadframe via solder balls or conductive pillars.

8. The IC package of claim 1, in which the leadframe has a first layer and a second layer, the inductor is in the first layer and connects to the second layer, and the second layer electrically connects to the semiconductor die.

9. The IC package of claim 8, in which the inductor is serpentine-shaped.

10. The IC package of claim 1, in which the leadframe has a first layer, a second layer, and a third layer, the inductor is formed within the first and second layers, and the third layer connects to the semiconductor die.

11. The IC package of claim 10, in which the inductor is spiral-shaped.

12. The IC package of claim 1, in which the magnetic mold compound has a relative permeability of at least 5.

13. An integrated circuit (IC) package, comprising:
    a semiconductor die;
    a leadframe having leads coupled to bond pads on the semiconductor die;
    first and second inductors including respective first and second electrically conductive members coupled to the leadframe and encapsulated in a magnetic mold compound, each electrically conductive member having opposed ends and having a standoff on at least one of the ends coupled to the leadframe; and
    a protective mold compound around the semiconductor die, the leadframe, and the first and second inductors.

14. The IC package of claim 13, in which the inductors are on a same side of the semiconductor die as the leadframe.

15. The IC package of claim 13, in which the first inductor is spiral-shaped and the second inductor is serpentine-shaped.

16. The IC package of claim 13, in which the semiconductor die includes a voltage-regulator circuit electrically coupled to the inductors.

17. The IC package of claim 13, in which the protective mold compound is not magnetic.

18. The IC package of claim 1, in which the first electrically conductive member has a spiral shaped portion with first and second ends, the first end of the spiral shaped portion is one end of the electrically conductive member and includes a first standoff coupled to the leadframe, the first electrically conductive member includes a conductive bridge extending from the second end of the spiral shaped member to a second standoff coupled to the leadframe at the other end of the electrically conductive member.

19. The IC package of claim 1, in which the second mold compound is a non-magnetic mold compound.

* * * * *